(12) United States Patent
Spry et al.

(10) Patent No.: US 11,004,802 B1
(45) Date of Patent: May 11, 2021

(54) RELIABILITY EXTREME TEMPERATURE INTEGRATED CIRCUITS AND METHOD FOR PRODUCING THE SAME

(71) Applicant: United States of America as represented by the Administrator of NASA, Washington, DC (US)

(72) Inventors: David J. Spry, Medina, OH (US); Philip G. Neudeck, Olmsted Township, OH (US)

(73) Assignee: United States of America as Represented by the Administrator of National Aeronautics and Space Administration, Washington, DC (US)

( * ) Notice: Subject to any disclaimer, the term of this patent is extended or adjusted under 35 U.S.C. 154(b) by 31 days.

(21) Appl. No.: 16/158,748

(22) Filed: Oct. 12, 2018

Related U.S. Application Data

(60) Provisional application No. 62/571,902, filed on Oct. 13, 2017.

(51) Int. Cl.
| | | |
|---|---|---|
| *H01L 23/00* | (2006.01) | |
| *H01L 29/16* | (2006.01) | |
| *H01L 23/544* | (2006.01) | |
| *H01L 21/768* | (2006.01) | |
| *H01L 21/78* | (2006.01) | |
| *H01L 23/522* | (2006.01) | |

(52) U.S. Cl.
CPC ...... *H01L 23/562* (2013.01); *H01L 21/76802* (2013.01); *H01L 21/76877* (2013.01); *H01L 21/78* (2013.01); *H01L 23/5226* (2013.01); *H01L 23/544* (2013.01); *H01L 24/06* (2013.01); *H01L 29/1608* (2013.01); *H01L 2223/54426* (2013.01); *H01L 2224/06135* (2013.01); *H01L 2924/3512* (2013.01)

(58) Field of Classification Search
CPC ....... H01L 2924/00; H01L 2924/00014; H01L 2224/73204; H01L 2224/16225; H01L 2224/32225
See application file for complete search history.

(56) References Cited

U.S. PATENT DOCUMENTS

| | | | | |
|---|---|---|---|---|
| 2015/0228583 A1* | 8/2015 | Karhade | ............... | H01L 23/538 257/774 |
| 2015/0258769 A1* | 9/2015 | Farah | .................... | C30B 29/406 156/711 |

OTHER PUBLICATIONS

P. G. Neudeck et al., "Experimentally observed electrical durability of 4H-SiC JFET ICs operating from 500° C to 700° C," 2016 European Conference on Silicon Carbide & Related Materials (ECSCRM), Halkidiki, 2016, pp. 1-1.

(Continued)

*Primary Examiner* — Tony Tran
(74) *Attorney, Agent, or Firm* — Robert H. Earp, III; Mark Wolfgang; Helen M. Galus

(57) ABSTRACT

An integrated circuit chip includes a wide bandgap semiconductor substrate, a plurality of semiconductor electronic components disposed on the semiconductor substrate, an overlying insulating layer disposed on the plurality of semiconductor devices, and a crack barrier laterally displaced from all of the plurality of semiconductor components. The crack barrier is configured to prevent propagation of cracks in the overlying insulating layer. The crack barrier does not conductively connect to any of the plurality of semiconductor electronic components.

9 Claims, 6 Drawing Sheets

(56) References Cited

OTHER PUBLICATIONS

David Spry et al., (2016) Processing and Characterization of Thousand-Hour 500° C Durable 4H-SiC JFET Integrated Circuits. Additional Conferences (Device Packaging, HiTEC, HiTEN, & CICMT): May 2016, vol. 2016, No. HiTEC, pp. 000249-000256.
David Spry et al., Durability Testing of 4H SiC JFET Integrated Circuit Technology at 727° C , Proceedings vol. 9836, Micro- and Nanotechnology Sensors, Systems, and Applications VIII; 98360N (2016) https://doi.org/10.1117/12.2232926 Event: SPIE Defense + Security, 2016, Baltimore, Maryland, United States.
CrackingFencePN image.
SPIEFigureAnnotated.

* cited by examiner

RELIABILITY EXTREME TEMPERATURE INTEGRATED CIRCUITS AND METHOD FOR PRODUCING THE SAME

CROSS REFERENCE TO RELATED APPLICATION

This application is a non-provisional of, and claims priority to, U.S. Provisional Patent Application Ser. No. 62/571,902, filed on Oct. 13, 2017. The subject matter of this earlier-filed application is hereby incorporated by reference in its entirety.

ORIGIN OF DISCLOSURE

The present disclosure is based on work performed by employees of the United States Government and may be manufactured and used by or for the Government for Government purposes without the payment of any royalties thereon or therefore.

TECHNICAL FIELD

The invention is in the field of semiconductor devices. In particular, wide band gap semiconductor integrated circuits for use in high temperature and prolonged time period applications.

BACKGROUND

As the reliable operating temperature envelope of integrated silicon electronics has been expanded from 125° C. to temperatures above 200° C., these electronics have found beneficial use in aerospace, automotive, industrial and energy production systems. Further extension of the reliable operational envelope of semiconductor electronics above 300° C. is also expected to offer additional benefits to these industries, particularly in aerospace combustion engine applications where operating temperatures can approach or exceed 600° C. The emergence of wide band gap semiconductors including silicon carbide (SiC), diamond, and gallium nitride (GaN), has enabled short-term electrical device demonstrations at ambient temperatures from 500° C. to 650° C. However, these devices have previously not demonstrated sufficient long-term durability when electronically operated at these high temperatures to be considered viable for most envisioned applications above 300° C. It is desired to provide a method for fabricating semiconductor devices that may be successfully and reproducibly operated continuously at temperatures of at least 500° C. for over at least 10,000 hours in air ambient with no more than a 10% change in operational transistor electrical parameters.

SUMMARY

One embodiment is directed to an electronic integrated circuit chip. The integrated circuit chip includes a wide bandgap semiconductor substrate, a plurality of semiconductor electronic components disposed on the substrate, at least one overlying insulating layer disposed on the plurality of semiconductor devices, and a first crack barrier disposed laterally between at least two of the plurality of semiconductor devices. In some embodiments, the first crack barrier is encapsulated within dielectric material that the at least one overlying insulating layer may be constructed of. For example, in certain embodiments, the first crack barrier may be completely surrounded by the dielectric material, which may be used to construct both the at least one insulating layer and another insulating layer disposed on the wide bandgap semiconductor substrate. In various embodiments, the first crack barrier does not overlap any of the semiconductor devices, and the crack barrier does not carry any electrical signals between the semiconductor devices.

In some embodiments, the integrated circuit chip further comprises a plurality of interconnect traces that are separate from the first crack barrier and a plurality of bond pads that are also separate from the first crack barrier. The first crack barrier does not overlap with any of the interconnect traces and bond pads or electrically connect any of the semiconductor electronic components to the bond pads and interconnect traces. In such embodiments, the integrated circuit chip may also include a first insulating layer disposed directly on the plurality of semiconductor devices and a first electrically conductive interconnect layer disposed on the first insulating layer and between the first insulating layer and the overlying at least one insulating layer. Some regions of the electrically conductive interconnect layer are in electrical contact with at least some of the plurality of semiconductor devices, while other regions of the electrically conductive interconnect layer are fully encapsulated by dielectric material and thus are not in electrical contact with the semiconductor devices. The crack barrier may be formed from selective lateral patterning of the first interconnect layer material, but the crack barrier does not form electrical connection between semiconductor electronic devices and bond pads.

In some embodiments, the first crack barrier includes a first plurality of spaced apart segments. The first plurality of spaced apart segments may be linearly arranged. The crack barrier may also include a second and a third plurality of spaced apart segments that are parallel to the first plurality of spaced apart segments. The spacing between the segments of the first plurality may be different than the spacing between segments of the second plurality. Additionally, in certain embodiments, the first, second, and third pluralities of segments possess different lengths. In some embodiments, the different lengths of multiple pluralities of segments of crack barrier are selected to prevent straight-line crack from crossing all segment spacings.

In some embodiments, the first crack barrier laterally surrounds the semiconductor electronic components. The integrated circuit chip may also include a second crack barrier laterally extending between two groupings of semiconductor electronic components and a third crack barrier laterally surrounding alignment marks on the substrate. The integrated circuit chip may also include a fourth crack barrier laterally residing around the entire chip periphery between the region of wafer dicing kerf loss/damage and the chip bond pads. As will be appreciated, in various embodiments, the integrated circuit chip may comprise any combination of the first, second, third, and fourth crack barriers depending on the implementation.

Another embodiment relates to a method. The method includes forming a plurality of semiconductor electronic components on a wide bandgap semiconductor substrate-wide and depositing an interconnect structure on the wide bandgap semiconductor substrate. The interconnect structure is for electrically interconnecting groupings of the plurality of semiconductor electronic components to one another. The step of depositing the interconnect structure also includes forming a plurality of electrically isolated cracking barriers on the wide bandgap semiconductor substrate in regions not overlapping regions where the semiconductor electronic components are disposed.

In some embodiments, depositing the interconnect structure includes depositing a first insulating layer on the plurality of semiconductor electronic components, patterning the first insulating layer, depositing a first interconnect layer on the first insulating layer with some selected first interconnect patterns forming electrical interconnects that conductively carry electrical signals between the plurality of semiconductor electronic components while other selected first interconnect layer patterns form crack barriers that are not conductively/electrically connected to any of the plurality of semiconductor electronic components.

In some embodiments, the semiconductor substrate includes a plurality of circuitry regions separated by a plurality of cutting regions devoid of the semiconductor electronic components. The method may also include dicing the wafer into individual semiconductor chips by, for example, application of a dicing saw to the cutting regions. The plurality of crack barriers may include a plurality of periphery barriers extending around a periphery of one of the circuitry regions. The plurality of crack barriers may also include an alignment mark barrier surrounding alignment marks formed on the wide bandgap semiconductor substrate. The plurality of crack barriers may also include a plurality of inter-device barriers disposed between semiconductor electronic components in the circuitry regions.

In some embodiments, each crack barrier includes a component comprising a plurality of spaced apart segments. For example, in one embodiment, each crack barrier includes a plurality of components, and each component includes a plurality of linearly-arranged segments. Each of the components in each crack barrier may have segments of a different length than the other components of that crack barrier.

BRIEF DESCRIPTION OF THE DRAWINGS

In order that the advantages of certain embodiments will be readily understood, a more particular description of the invention briefly described above will be rendered by reference to example embodiments that are illustrated in the appended drawings. While it should be understood that these drawings depict only typical embodiments of the invention and are not therefore to be considered to be limiting of its scope, the invention will be described and explained with additional specificity and detail through the use of the accompanying drawings, in which.

DETAILED DESCRIPTION

Figure 1A:
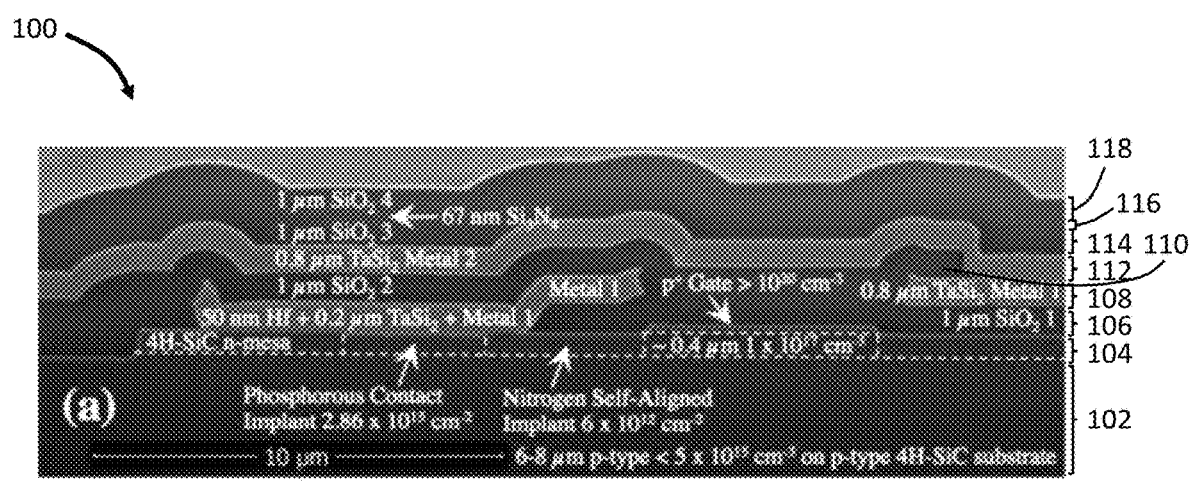
FIG. 1A depicts a cross-sectional micrograph of a related 4H—SiC JFET integrated with interconnect metal ("JFET-IWIM") forming part of a silicon carbide integrated circuit ("SiC IC").

As used herein, the term "semiconductor electronic component" refers to a microelectronic device comprised of and implemented on or in semiconductor for the purposes of performing an electronic/electrical circuit function. Examples of such components include resistors, capacitors, and transistors, as well as any other electrical component known in the art. As will be appreciated, various combinations of such "semiconductor electronic components" can be made to form various integrated circuits. Numerous such semiconductor microelectronic devices/circuits can be fabricated across the lateral surface area of a single semiconductor wafer (also referred to as "substrate"). Each semiconductor microelectronic device/circuit may occupy a finite physical lateral area (or lateral region) on/across the lateral wafer/substrate surface (referred to as the "electrically active area"), and within that finite electrically active area/region the desired electrical function is performed by the device or integrated circuit structures fabricated therein by semiconductor fabrication processes.

As used herein, the term "wide bandgap semiconductor" refers to any semiconductor having a bandgap greater than 2.5 eV.

As used herein, the term "laterally," when describing a feature (e.g., a component, circuit, layer, etc.) disposed on a semiconductor substrate, refers to a direction that is parallel to a deposition surface of that semiconductor substrate.

Referring generally to the Figures, described herein are extreme temperature integrated circuits ("ICs") including crack barriers to facilitate long-term operation thereof and methods for producing the same. The crack barriers described herein may be incorporated into numerous different semiconductor electronic components and designs. For example, the crack barriers described herein may be incorporated into any wide band gap semiconductor IC. Such ICs may include the SiC JFET integrated with two levels of interconnect metal ("JFET-IWIM") 100 depicted in FIG. 1. FIG. 1 depicts a cross-sectional micrograph of a 4H—SiC JFET-IWIM 100 previously developed by Applicant. As shown, the JFET-IWIM 100 generally includes a semiconductor substrate 102, a semiconductor device layer 104, a first insulating layer 106, a first metal interconnect layer 108, a second insulating layer 110, a second metal interconnect layer 112, a third insulating layer 114, a fourth insulating layer 116, and a fifth insulating layer 118. The third, fourth, and fifth insulating layers 114, 116, and 118 are an example of an "overlying insulating layer" described herein.

Various aspects of the production and function of the JFET-IWIM 100 have been described by Applicant elsewhere. For example, various aspects of the multi-layer interconnect structure (i.e., including the first insulating layer 106, the first metal interconnect layer 108, the second insulating layer 110, the second metal interconnect layer 112, a third insulating layer 114, a fourth insulating layer 116, and the fifth insulating layer 118) are described in U.S. Pat. No. 9,978,686, which is assigned to Applicant and entitled "Interconnection of Semiconductor Devices in Extreme Environment Microelectronic Integrated Circuit Chips," hereby incorporated by reference in its entirety. The self-aligned nitrogen implant depicted in the semiconductor device layer 104 is described in-depth in U.S. Pat. No.

8,841,698, which is assigned to Applicant and entitled "Method for Providing Semiconductors Having Self-Aligned Ion Implant," hereby incorporated by reference in its entirety.

The general method of fabricating the JFET-IWIM 100 has been described elsewhere by Applicant. See, for example, David J. Spry et al., "Evidence of Processing Non-Idealities in 4H—SiC Integrated Circuits Fabricated with Two Levels of Metal Interconnect," Materials Science Forum, Vol. 858, pp. 1112-1116 (2016), David J. Spry et al., "4H—SiC JFET Multilayer Integrated Circuit Technologies Tested Up to 1000 K," ECS Transaction, 69, pps 113-121 (2015), and David J. Spry et al., "Processing and Characterization of Thousand-Hour 500° C. 4H—SiC JFET Integrated Circuits," HiTEC, Volume 2016, pp. 249-256 (2016), hereby incorporated by reference in their entireties.

A simplified explanation of the fabrication of the JFET-IWIM 100 follows to support further discussion herein. It should be appreciated that various aspects of the fabrication are not described in detail for the purposes of simplifying discussion. In some embodiments, the semiconductor substrate 102 is a single-crystal type silicon carbide ("SiC") polytype such as 4H—SiC, 6H—SiC, and 3C—SiC. The substrate 102 may include a 4H—SiC epi-wafer comprising of a 4H—SiC bulk wafer with thin 4H—SiC epitaxial layers deposited thereon. In FIG. 1A, reference numeral 102 shows the epilayer portion, as underlying bulk wafer portion of the substrate is out the field of view. In other embodiments, other wide band gap materials, such as gallium nitrides, may also be used. The semiconductor device layer 104 may be formed within epitaxial layers having desired impurity concentrations that are deposited on the semiconductor substrate 102 through known deposition techniques. In alternative embodiments not depicted, the semiconductor device layer 104 may alternatively be formed/defined by ion implantation or diffusion techniques known in the art. In the example shown, semiconductor devices are formed within the semiconductor device layer 104 through known photolithography techniques. In this example, laterally-patterned removal of SiC materials defined by photolithographic-patterned Ti/Ni masks are used to laterally define gates, resistors, and channels in the semiconductor device layer 104. An interconnect structure is then formed. In the example shown, the interconnect structure is a multi-layer interconnect structure including the first insulating layer 106 patterned to include a first set vias therein. The first metal interconnect layer 108 is then deposited on the first insulating layer 106 and etched in a desired pattern such that portions thereof overlap the first set of vias to interconnect the semiconductor electronic components contained in the semiconductor device layer 104. The second insulating layer 110 is then deposited and patterned with another set of vias such that, upon deposition thereof, the second metal interconnect layer 112 is conductively connected to desired portions of the first metallic interconnect layer 108. Insulating layers 114, 116, and 118 are then deposited on the second metal interconnect layer 112. Insulating layers 114, 116, and 118 are patterned to provide contact areas for depositing bond pad structures that reside outside of the field of view of FIG. 1A, which are formed such that they connect to at least one of the metal interconnect layers 108 and 112.

Applicant has performed extensive testing on die including the JFET-IWIM 100 and a plurality of additional components at high temperatures. For example, Applicant performed one test where the temperature was increased 3° C. per minute until a peak temperature of above 700° C. was reached. In one test, the JFET-IWIM 100 started to exhibit performance degradations after about 23 hours of testing, with complete device failure occurring after about 70 hours of testing. Other structures functioned for longer times of about 150 hours of testing or more.

Figure 1B:
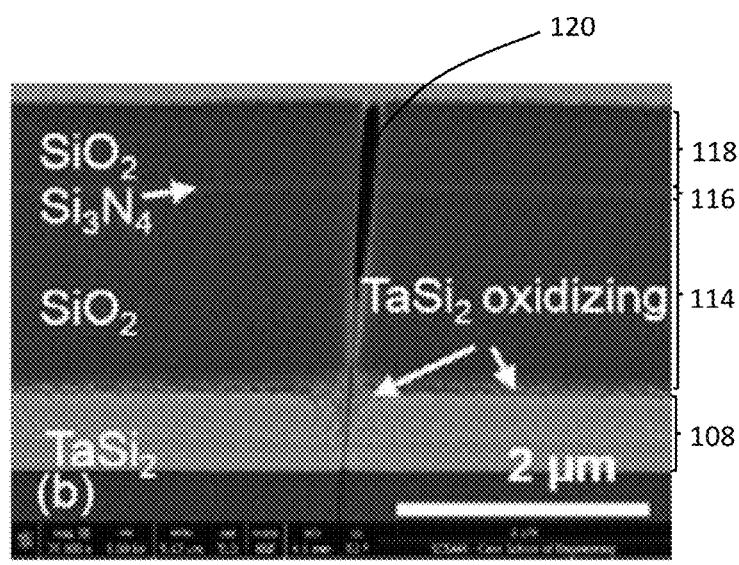
FIG. 1B depicts a cross-sectional micrograph of a portion of a SiC IC near a bond pad thereof after over 50 hours at approximately 700° C. The micrograph shows a crack in the dielectrics of the multi-level interconnect leading to oxidation of a metal trace.

Failure of the semiconductor electronic components operating at high temperatures are attributed at least in-part to crack formation in the overlying insulating layers 114, 116, and 118. FIG. 1B depicts a cross-sectional micrograph of a crack found in one of the tested dies. As shown, a crack 120 has formed that extends through the insulating layers 114, 116, and 118. The crack 120 allows oxygen to reach and oxidize the first metal interconnect layer 108 (which, in the region shown, forms a trace electrically connecting a semiconductor electronic component). This oxidation leads to undesired degraded conductivity of the first metal interconnect layer 108, and eventual undesired electrical disconnection of the nearby semiconductor electronic component. During testing, Applicant found several cracks initiated at larger-area metal traces associated with power bus interconnects and contact bond pads known in the art.

Through additional investigation, Applicant has discovered additional sources for dielectric cracks. For example, in many instances, Applicant has discovered cracks that appear to originate near the edge of the die. As is known in the art, die containing ICs are diced into individual chips using a high-speed diamond saw blade. Due to the peripheral nature of many observed cracks, these cracks appear to originate from contact between the dielectric and the high-speed saw blade. Moreover, Applicant has also observed cracks that appear to originate from lateral alignment mark patterns located in various die. As such, Applicant has identified three primary sources of cracks in the overlying dielectrics in extreme temperature ICs: (1) connections between larger-area metal traces and bond pads; (2) contact between the high-speed dicing saw and the overlying dielectric; and (3) stresses induced in the overlying dielectric by the lateral alignment marks formed on/in the underlying substrate.

Irrespective of their mode of origination, cracks formed in the overlying dielectric may propagate laterally significant distances from their point of origin, leading to failure of other devices contained in the die at different lateral locations than where the crack originated. As such, mechanisms for preventing dielectric crack initiation and subsequent propagation would improve longevity of operation for extreme temperature ICs. Through extensive testing and observation, Applicant has found that metallic features (e.g., traces leading interconnecting semiconductor electronic components and bond pads) in the ICs tend to prevent cracks originating on one lateral side the metallic feature from propagating to the other lateral side of the metallic feature. For example, in certain observations, Applicant has observed that a metallic trace formed of a portion of the first metal interconnect layer 108 (or another, similarly situated layer) prevented lateral propagation of dielectric layer cracks originating on one lateral side thereof to the opposing lateral side. This presents an opportunity to improve longevity of the extreme temperature ICs without increasing the complexity of the fabrication process: By altering mask patterns of the interconnect fabrication process described herein in a strategic manner, crack barriers can be strategically situated within dies to prevent cracks from reaching and degrading operation of critical IC components.

Figure 2:
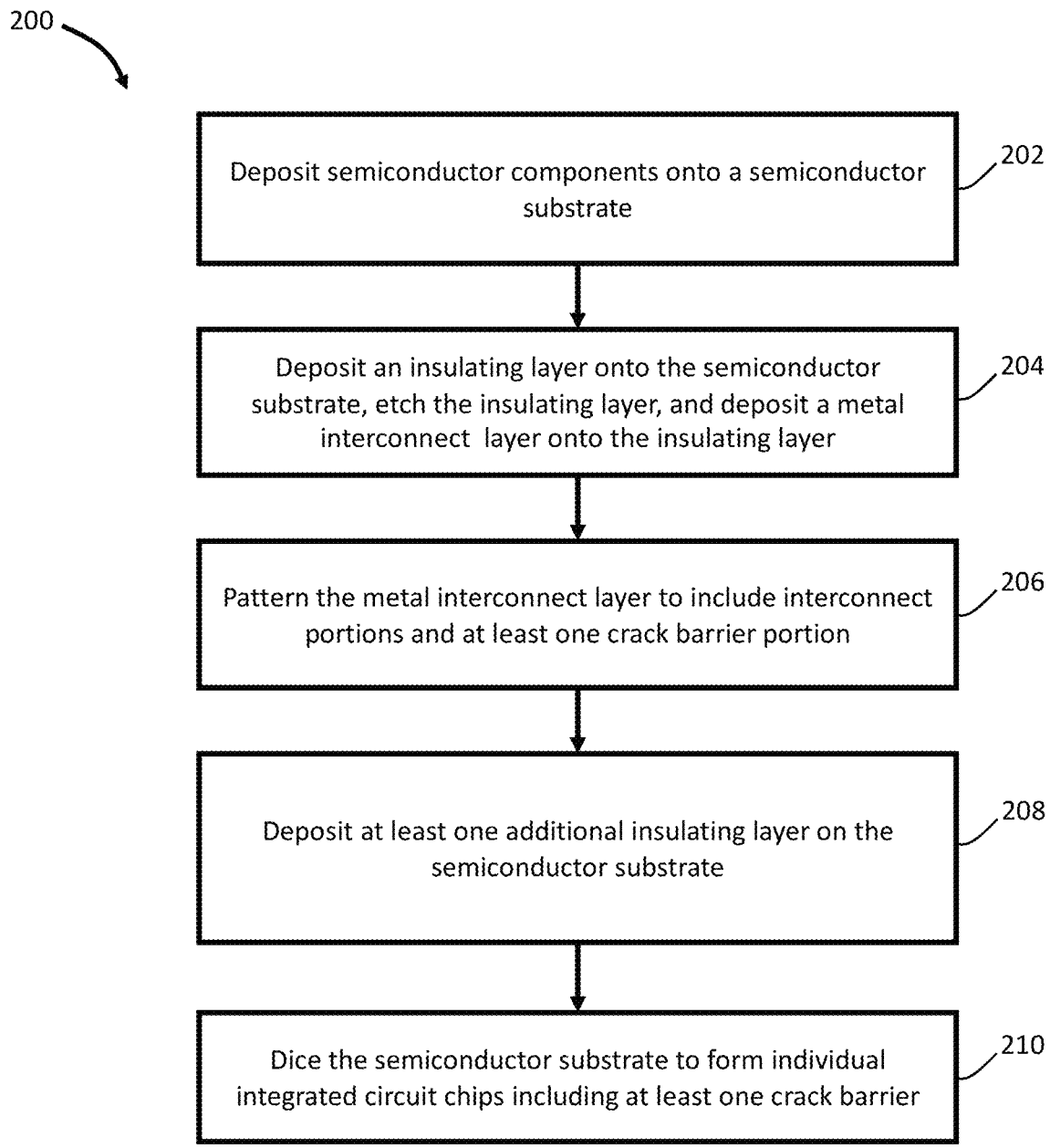
FIG. 2 depicts a flow diagram of a method of forming high temperature IC having at least one crack barrier, according to an example embodiment.

Referring now to FIG. 2, a flow diagram of a method 200 of fabricating extreme temperature IC chips containing at least one crack barrier is shown, according to an example embodiment. Method 200 may be performed to form a plurality of die from a wide band gap semiconductor wafer.

Each die may include a plurality of semiconductor electronic components that are interconnected in a desired fashion to form various semiconductor devices for performing various electronic functions. Each die also includes at least one crack barrier configured to prevent propagation of cracks to crucial IC devices, circuits, and connection points, and is capable of successful electrical operation under exposure to extreme temperature environments for longer periods than existing extreme temperature ICs.

In an operation 202, semiconductor electronic components are deposited onto a semiconductor substrate. In various embodiments, the semiconductor substrate is a wide bandgap semiconductor substrate. In some embodiments, the semiconductor substrate is a single-crystal type SiC such as 4H—SiC, 6H—SiC, and 3C—SiC. For example, in one embodiment, the semiconductor substrate is a 4H—SiC epi-wafer comprising of a 4H—SiC bulk wafer with thin 4H—SiC epitaxial layers deposited thereon. In other embodiments, other wide band gap materials, such as gallium nitrides, may also be used. A plurality of epitaxial layers having desired impurity concentrations may also be deposited on the substrate to facilitate formation of semiconductor devices thereon. The epitaxial layers may be deposited via any method known in the art.

Various features of the semiconductor electronic components (e.g., channels, gates, etc.) may be formed via known photolithographic patterning techniques on the epitaxial layers/semiconductor substrate. For example, in one embodiment, three epitaxial layers are disposed on the semiconductor substrate: a p-doped layer, an n-type layer, and a p-type layer. In one example, the uppermost epitaxial layers are patterned and etched using photolithographically patterned Ti/Ni masks, followed by dry etching using a parallel plate reactive ion etcher (RIE) with argon and sulfur hexafluoride. The patterned epitaxial layers may then be implanted to form desired components. The semiconductor electronic components may have a variety of forms and functionalities consistent with the present disclosure. For example, one or more of semiconductor devices may take the form of the JFET-IWIM 100 described with respect to FIG. 1A. Other semiconductor devices such as resistors and the like may also be formed. The number and types of semiconductor devices formed may vary depending on the desired functionalities of the IC chips sought to be formed.

As will be appreciated, different sets of semiconductor devices may be formed in predefined lateral regions on the semiconductor substrate. Some lateral regions may correspond to a die eventually cut from the remainder of the semiconductor substrate to form an independent IC chip. The predetermined die/chip regions may form a grid array on the semiconductor substrate and be separated from one another by more than the lateral Kerf width associated with the cutting mechanism through which the semiconductor substrate is cut.

In an operation 204, an insulating layer is deposited onto the semiconductor substrate, a pattern is etched into the insulating layer, and an electrically conductive metal interconnect layer is deposited onto the insulating layer. In certain embodiments, the insulating layer is a dielectric layer composed of $SiO_2$. The insulating layer may be patterned using standard photolithographic techniques. Generally, the pattern in the insulating layers includes a plurality of vias. The plurality of vias may include at least one via for each of the semiconductor devices formed at 202. The vias provide electrical connections points with the underlying semiconductor devices. Some or all of the semiconductor devices may have multiple vias situated directly above them to facilitate formation of complex interconnect structures needed to realize desired electrical circuit function. In some embodiments, ohmic contacts are formed prior to deposition of the metal interconnect layer, as described in U.S. Pat. No. 9,978,868.

After patterning of the first insulating layer and the formation of any ohmic contacts on the semiconductor devices, the electrically conductive metal interconnect layer is disposed on the semiconductor substrate. In certain implementations, the electrically conductive metal interconnect layer is a $TaSi_2$ layer disposed to cover the entirety of the semiconductor substrate using close-proximity sputtering in a UHV system. As will be appreciated, the substrate may be baked prior to the sputtering to mitigate oxygen contamination. In some embodiments, the electrically conductive metal interconnect layer is approximately $1/4^{th}$ of the overall stack dimension (i.e., a quarter of all the materials deposited onto the semiconductor substrate) and/or approximately 1 micron (e.g., 0.8 microns) in thickness. The metal interconnect layer is $TaSi_2$ in some embodiments, but alternative materials may be used so long as they are sufficiently electrically conductive.

In an operation 206, the electrical metal interconnect layer is patterned such that, after the patterning, the metal interconnect layer includes interconnect portions that carry electrical signals to or from an electrically active semiconductor electronic component in addition to at least one distinct crack barrier portion that does not carry electrical signal to any electrically active semiconductor electronic component. The interconnect portions generally serve to electrically connect the semiconductor devices to one another and to bond pads that are eventually formed on the semiconductor substrate. In other words, the interconnect portions may interconnect multiple ones of the semiconductor devices formed at 202 to form ICs performing various electrical functions (e.g., oscillators, memory, counters, adders, etc.). Other interconnect portions may form traces that eventually connect individual ones (or sets) of the semiconductor devices to bond pads formed on the wafer. In some embodiments, the bond pads are gold layers deposited on the iridium interfacial stack structure described in U.S. Pat. No. 9,013,002, entitled "Iridium Interfacial Stack (IRIS)" and assigned to Applicant, hereby incorporated by reference in its entirety.

Generally, the crack barrier portions of the metal interconnect layer do not serve to conductively electrically connect components of ICs. The crack barrier portions are patterned to impede propagation of cracks that may form in dielectric layers that are eventually deposited on the metal interconnect layer. As such, the crack barrier portions are generally disposed such that they are between a likely point of origin of a crack and at least one of the electrical interconnect portions. Accordingly, certain crack barrier portions may be situated such that they lie between an intended boundary of a die that will eventually be cut from the semiconductor substrate and at least one of the electrical interconnect portions, semiconductor electronic components, or locations of bond pads that are to disposed on the semiconductor substrate after formation of the crack barrier portions. Examples of the crack barrier portions are described in greater detail with respect to FIGS. 3-6.

While the crack barrier portions of the metal interconnect layer have been described as being included within a metal layer disposed immediately adjacent to a first insulating layer disposed on the semiconductor substrate, it should be understood that alternative structures are envisioned. For example, in embodiments including multiple metal interconnect layers, the crack barrier portions may be included in metal interconnect layers that are not the closest interconnect layers to the substrate. Alternatively or additionally, it is also envisioned that multiple crack barrier features could be included in multiple, separate metallic interconnect layers simultaneously. In other words, a first metallic interconnect layer disposed closest to the semiconductor substrate may include a first crack barrier portion while a second metallic interconnect layer disposed on the first metallic interconnect layer 108 (e.g., directly in some regions and indirectly in others) or second dielectric layer 110 or suitable combination thereof may include a second crack barrier portion.

In an operation 208, at least one additional insulating layer is disposed on the semiconductor substrate. In some embodiments, an additional metal layer may be disposed on the additional insulating layer and yet another insulating layer(s) may be disposed on the additional metal layer. For example, in some embodiments, the additional insulating and metal layers are deposited to complete a multi-level interconnect structure interconnecting the semiconductor electronic components formed on the wafer. The multi-level interconnect structure may take the form described in U.S. Pat. No. 9,978,686. Accordingly, the additional insulating layer(s) may completely cover the patterned metal interconnect layer and be patterned with vias to facilitate formation of conductive contact between the metal interconnect layer deposited at 204 and an additional metal layer. In certain embodiments, the last metal layer deposited on the wafer may be patterned to form contact pads for conductive connections with the metallic interconnect layer.

Thus, after 208, the wafer may include a plurality of IC chips thereon including pluralities of semiconductor electronic components interconnected in various configurations. Each of the IC chips may be disposed in a particular region on the wafer that is separated from adjacent IC chips by cutting regions. The cutting regions may correspond to areas where a cutting mechanism (e.g., a laser or a saw) is applied to the semiconductor substrate to separate the multiple IC chips manufactured on a single semiconductor wafer from one another. The cutting regions may have a lateral width that is at least the Kerf width (known in the art) of the cutting mechanism.

In certain embodiments, the various layers of the interconnect structure are patterned to mitigate the probability of crack formation in the insulating layers therein. For example, in some embodiments, selected lateral areas of the dielectric layers above the metal interconnect layer deposited at 204 and/or 208 are patterned (preferably by patterned etch-removal processes known in the art) such that there is no dielectric material exposed within the lateral cutting regions of the semiconductor substrate. That way, direct contact between the dielectric material and the cutting mechanism that could initiate a crack in the dielectric material is avoided. This also reduces internal stresses from building up in the dielectric layer that also lessens the probability of crack formation. In other words, during the formation of the multi-layer interconnect structure conductively connecting the semiconductor electronic components, both metallic and dielectric layers are patterned to mitigate crack formation and propagation.

In an operation 210, the semiconductor substrate is diced to form individual IC chips as known in the art. In some embodiments, the dicing is performed using a diamond saw blade, but other methods, such as laser cutting, may be used in other embodiments. Each IC chip formed may include at least one crack barrier. As will be appreciated, after the dicing, the IC chips formed via the method 200 may be attached to a ceramic substrate to form an IC chip package and/or circuit board including, for example, a power source and I/O components to form an operational extreme temperature logic electronic device/circuit. Through incorporation of at least one of the crack barrier features described herein, the extreme temperature logic device may be capable of operating for thousands of hours at temperatures greater than or equal to 500° C.

Figure 3:
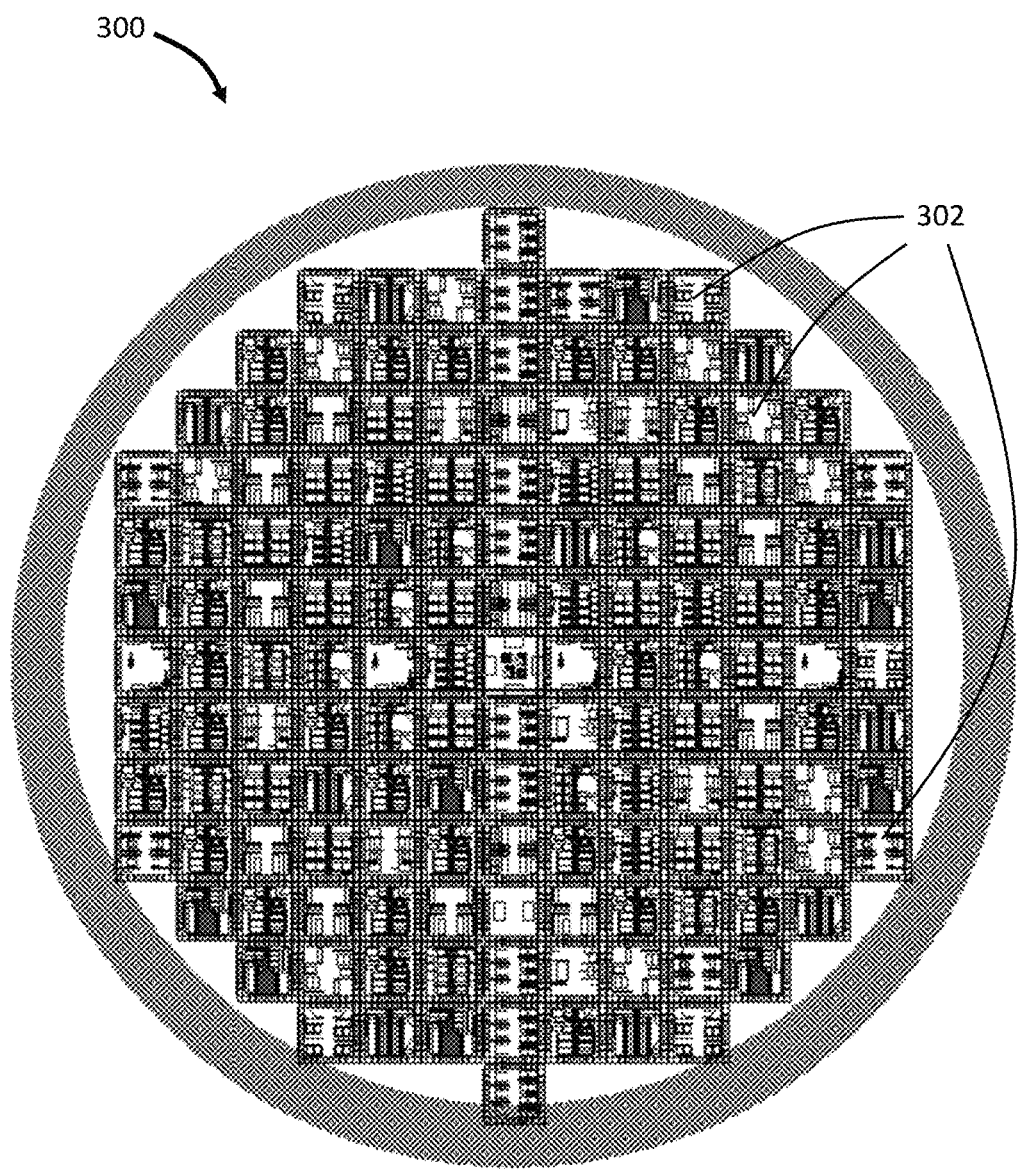
FIG. 3 depicts a design drawing view of a wafer having a plurality of high temperature semiconductor devices disposed thereon, according to an example embodiment.

Referring now to FIG. 3, a design drawing top view of a wafer 300 including a plurality of integrated circuit chip regions 302 is shown, according to an example embodiment. Wafer 300 is an example of a component that may be formed via performance of operations 202, 204, 206, and 208 of the method 200 described with respect to FIG. 2. In the example shown, the wafer is a 3-inch diameter SiC wafer, though wafers of other materials and sizes may be used consistent with the present disclosure. Each of the circuit chip regions 302 may include at least one semiconductor electronic component and a metal interconnect structure conductively/electrically connecting that semiconductor electronic component to another semiconductor electronic component (e.g., a bond pad, another semiconductor electronic component, etc.). As shown, the circuit chip regions 302 form a grid-like array pattern on the wafer 300 so that the wafer may be diced into a plurality of die (chips) containing various combinations of electronic device and/or integrated circuit semiconductor electronic components.

Figure 4:
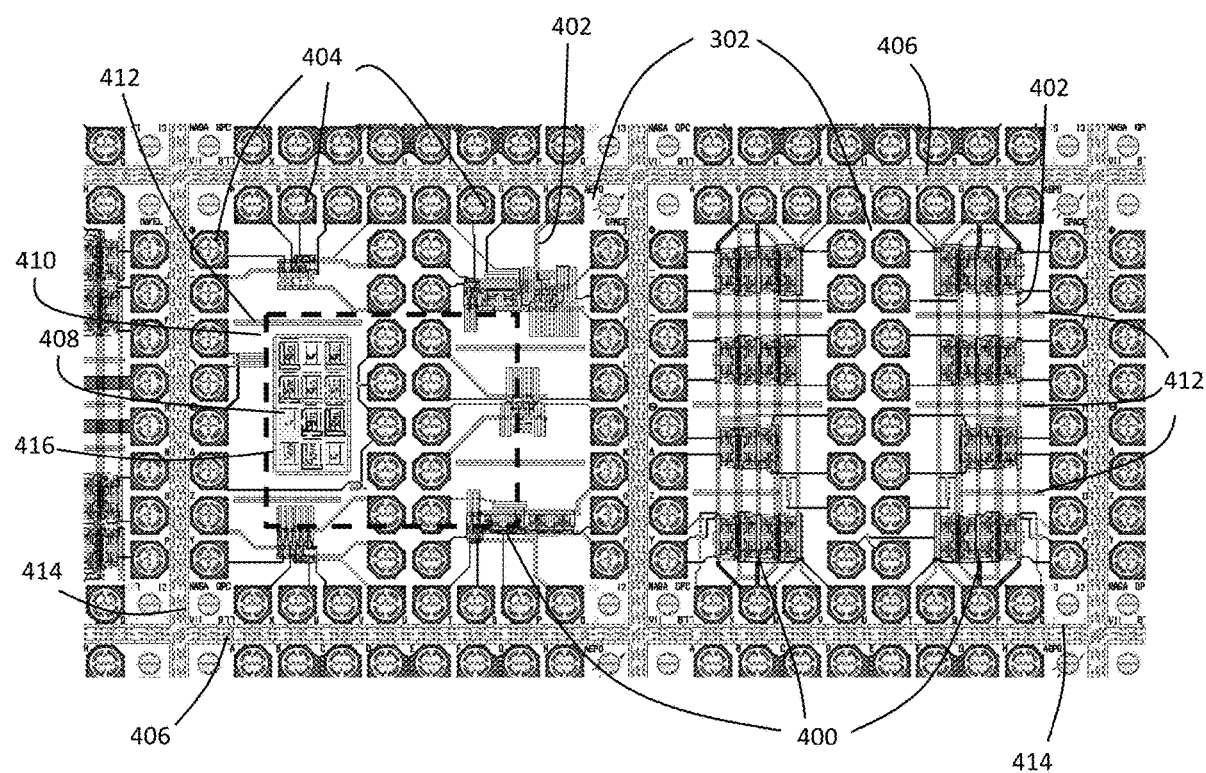
FIG. 4 depicts a zoomed-in view of two adjacent die sections of the wafer depicted in FIG. 3 including a plurality of crack barriers, according to an example embodiment.

Referring now to FIG. 4, a close-up view of the design drawing detailing two of the circuit chip regions 302 contained on the wafer 300 of FIG. 3 is shown, according to an example embodiment. As shown, the circuit chip regions 302 each contain a plurality of semiconductor devices 400, interconnect traces 402, and bond pads 404. Semiconductor devices 400 may include a plurality of semiconductor electronic components interconnected with one another via a multi-layer interconnect structure. The multi-layer interconnect structure includes at least one metal interconnect layer that is patterned to include the interconnect traces 402 that electrically interconnect the semiconductor devices 400 to one another and to bond pads 404. Interconnect traces 402 may be comprised of first metal 108 or second metal 112 described previously with reference to FIG. 1A or any other additional metal layers used to electrically interconnect devices in wafer fabrication processes with more than two levels of metal interconnect. Additionally, the multi-layer interconnect structure includes a dielectric overlying the semiconductor electronic components except where electrical bond pads 404 laterally reside. As is known in the art, the top surfaces of the bond pads must not be overcoated by dielectric materials in order to facilitate bonding of electrically conductive signal bond wires or package traces used to electrically connect the chip to other off-chip circuitry.

Each of the circuit chip regions 302 is laterally surrounded by a selected and suitable cutting region 406. The cutting region 406 corresponds to a region of the wafer 300 devoid of any circuitry components so that the circuitry regions 302 may be cut into separate IC chips by, for example, a dicing saw. In this example, the cutting regions 406 do not include the any dielectric of the multi-layer interconnect structure. As described herein, avoiding direct contact between the overlying dielectric and the cutting mechanism prevents cracks from forming in the overlying dielectric that leads to oxidation of the interconnect traces 402 and eventual electrical failure.

Applicant has found several additional sources for cracks forming in the overlying dielectric that may hinder longevity of the ICs created via circuit chip regions 302. For example, faulty connections between interconnect traces 402 and bond pads 404 may eventually lead to crack formation, especially for bond pads connected to relatively high power interconnect traces that feature/require relatively larger trace lateral widths. Additionally, Applicant has found alignment marks 408 (known and supporting the art of semiconductor device manufacture, contained in an alignment mark region 410 of the circuitry region 302 on the left) to be particularly conducive to crack formation.

To prevent cracks from propagating within the overlying dielectric to other critical circuitry components, circuit chip regions 302 contain several crack barriers of the present invention. It is desired that at least one crack barrier reside laterally between any known point of crack origin and critical electronic circuitry components (e.g., semiconductor devices 400, interconnect traces 402, and bond pads 404). Circuit chip regions 302 are shown to include inter-device crack barriers 412, periphery crack barriers 414, and, where applicable, alignment mark crack barriers 416. It should be appreciated that circuit chip regions 302 may contain any number of crack barriers, including those proximate to or surrounding to crack sources not described herein.

Inter-device crack barriers 412 are generally disposed to reside laterally between a semiconductor device 400 and another circuitry element (e.g., another semiconductor device 400, a bond pad 404, etc.). This way, cracks originating at one element may not propagate and hinder performance of another proximate element. Inter-device crack barriers 412 are laterally linear in the shown embodiment, but may have lateral non-linear forms in alternative embodiments. Periphery crack barriers 414 may extend laterally along an entirety of the peripheral edge of the circuitry regions 302. Preferably, periphery crack barriers 414 lie proximate to the cutting region 406 such that cracks originating from the cutting region 406 do not propagate inwards towards the interior of the circuit chip regions 302. Alignment mark crack barriers 416 surround the alignment marks 408 blocking the propagation of cracks originating therefrom. In some embodiments, inter-device crack barriers 412, periphery crack barriers 414, and alignment mark crack barriers 416 include a multi-feature, discontinuous lateral structure described in more detail herein with respect to FIGS. 5-6.

Figure 5:
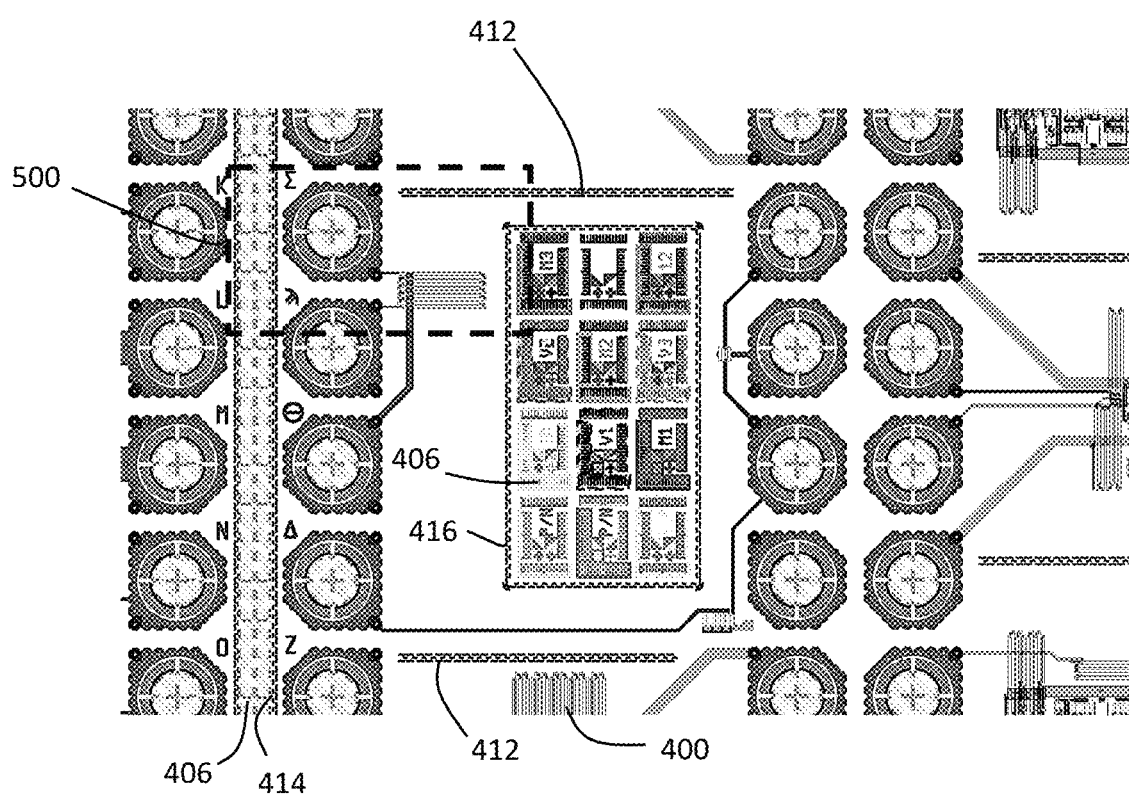
FIG. 5 depicts a further zoomed-in view of an alignment mark portion of one of the die sections depicted in FIG. 4, according to an example embodiment.

Turning now to FIG. 5, a close-up design drawing top view of the alignment mark region 410 of FIG. 4 is shown, according to an example embodiment of the present invention. As shown more clearly in FIG. 5, the peripheral crack barrier 414 is a linear crack barrier coextensive with and laterally paralleling the lateral extent of the cutting region 406. Inter-device crack barriers 412 laterally lie between the alignment marks 406 and additional semiconductor devices 400. This way, cracks originating from alignment marks 406 need to propagate through both the alignment mark crack barrier 416 and the inter-device crack barrier 412 to reach additional semiconductor electronic components 400. It should be appreciated that IC chips described herein may include any number of different inter-device barriers 412 that generally extend between groupings of semiconductor electronic components. FIG. 5 also depicts that the crack barriers 412, 414, and 416 do not serve to electrically interconnect circuit components. In other words, despite the fact that crack barriers 412, 414, and 416 are comprised of electrically conductive interconnect material(s), no conductive pathway exists or is formed between any of the crack barriers 412, 414, and 416 and electrically active/electronic bond pads 404/semiconductor devices 400. Such a configuration is beneficial in that it simplifies fabrication of the wafer 300. Non-connected barriers may be added to existing circuit designs without changing the underlying electrical circuit interconnections (e.g., interconnects 402) between semiconductor devices 400. Additionally, non-connected barriers may be fabricated to possess the non-continuous structure described with respect to FIG. 6. Nevertheless, connective barriers conductively and electronically connecting various circuit components may be included on the wafer 300 consistent with the present disclosure.

Figure 6:
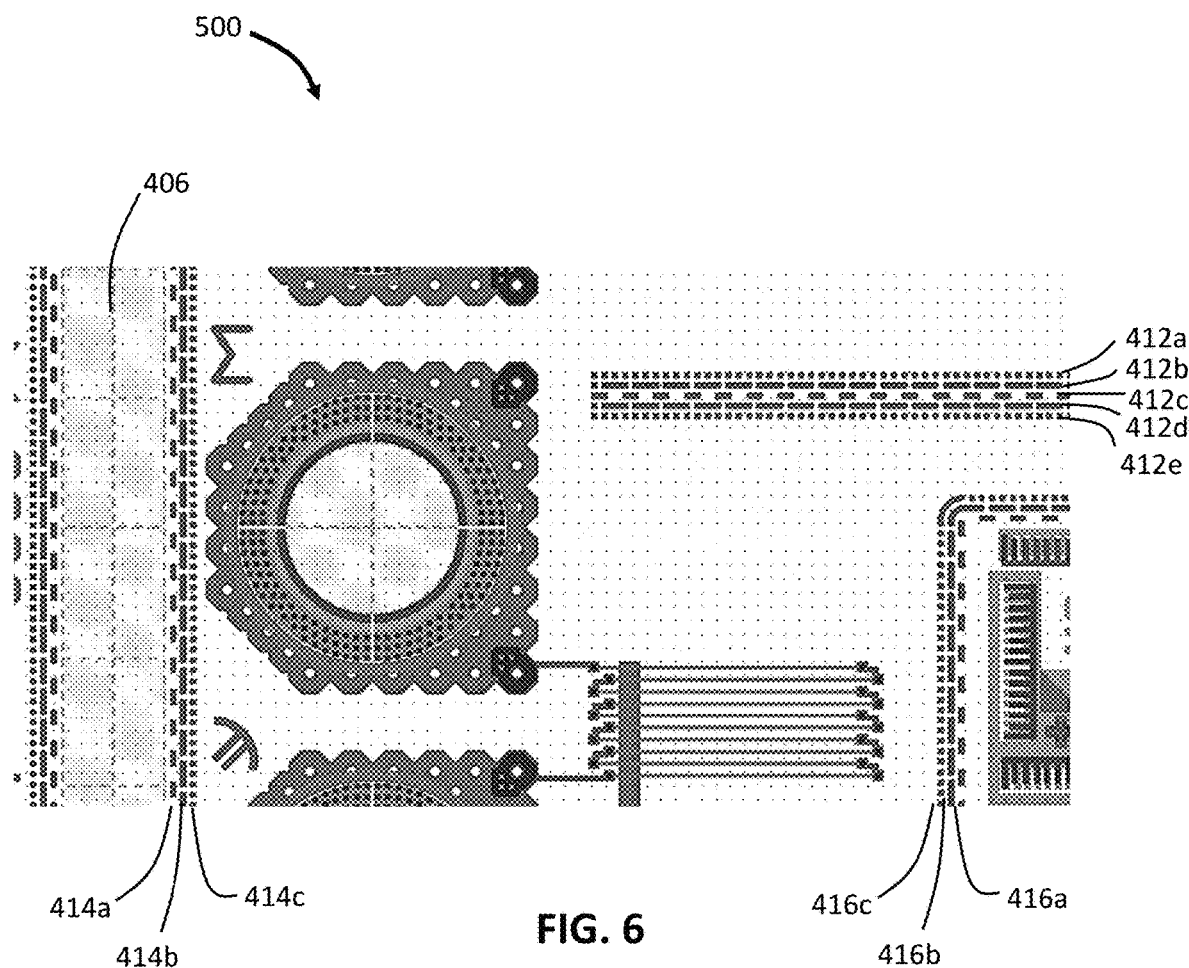
FIG. 6 depicts a further zoomed-in view of a contact pad of one of the die sections depicted in FIG. 4, including portions of the plurality of crack barriers, according to an example embodiment.

Referring now to FIG. 6, a close-up detail drawing top view of the contact pad region 500 of FIG. 5 is shown, according to an example embodiment. It should be noted that the array of dots visible in FIG. 6 are not actual features fabricated in the IC, but are instead drawing grid reference points rendered by design drawing software that become visible at the higher magnifications. As shown, the inter-device crack barrier 412 includes a first plurality of crack barrier components 412*a-e*, the peripheral crack barrier 414 includes a second plurality of crack barrier components 414*a-c*, and the alignment mark crack barrier 416 includes a third plurality of crack barrier components 416*a-c*. As shown, each of the barrier components 412*a-e* in the inter-device barrier 412 constitutes a plurality of segments with spacings. In the particular embodiment illustrated in FIG. 6, the plurality of segments can be comprised of identical and repeated segments with length and width lateral dimensions and each segment separated with consistent repeated segment-to-segment lateral spacing. All segments in the FIG. 6 illustrated embodiment are physically comprised of first metal layer 108, but other physical segment compositions (e.g., second metal layer 112) and combinations to be described can be employed. Outer components 412*a* and 412*e* have segments of the same segment lateral dimensions (length and width) segment-to-segment lateral spacing. Components 412*b* and 412*d* are also comprised of segments of the same lateral length and spacing. Outer components 412*a* and 412*e* have shorter segment length than components 412*b* and 412*d*. Central component 412*c* has lateral segment length longer than outer components 412*a* and 412*e* but shorter than components 412*b* and 412*b*. The central component 412*c* has the largest lateral spacing between segments. Additionally, the segments of the central component 412*c* are aligned with respect to spaces between segments of the outer components 412*a* and 412*e*. In other words, the segments of the components are offset from one another such that there are no spaces that extend through the entirety of the inter-device crack barrier 412 in a direction perpendicular to the inter-device barrier 412's longitudinal axis.

The shown structure of the plurality of barrier components 412*a-e* beneficially reduces metal film stresses over embodiments including "solid-line" (i.e., un-segmented) crack barriers. Using "solid-line" barriers, while possible, may lead to increased metal film stresses that could induce harmful film de-lamination and other damage. Using a plurality of differently segmented barrier components 412*a-e* also perturbs the stress field in the overlying dielectric to bend the direction of dielectric crack propagation to be parallel to the inter-device barrier 412. This way, cracks may be guided away from critical areas of the circuitry region 302.

As shown, an embodiment of the second plurality of barrier components 414*a-c* includes a first component 414*a* adjacent to the cutting region 406, a second component 414*b*, and a third component 414*c*. First component 414*a* possesses the greatest spacing between segments to minimize film stresses in an area most proximate to the sources of cracks. As shown, openings in the first component 414a are aligned with segments of the second component 414b such that any perpendicularly propagating crack would encounter at least one of the components 414a-414c. The third plurality of barrier components 416a-c is constructed similar to the second plurality of barrier components 414a-c, with the component 416a adjacent to the crack source (the alignment marks) having the greatest spacing between segments to minimize film stress.

While the various embodiments described herein possess a metallic crack barrier constructed of the same metal material and processing used to simultaneously construct an electrical interconnect structure, crack barriers comprised of different materials incorporated by different fabrication methods are also possible. The crack barrier layer needn't be constructed of metal. For example, a suitable crack barrier may be accomplished using patterned etching removal of dielectric material such as shown for dicing region 206. In particular, the patterned regions selected for removal of dielectric material could follow the same segmented patterns 412, 414, and 416 shown for the metal-based crack barriers in FIGS. 5-6. Likewise, similar patterns etched into the semiconductor itself (such as the SiC etch that patterned semiconductor electronic device layer 104) might also accomplish suitable and effective dielectric crack propagation barriers. Combinations of the above suggested crack barrier formation/fabrication techniques are also possible.

It will be readily understood that the components of various embodiments, as generally described and illustrated in the figures herein, may be arranged and designed in a wide variety of different configurations. Thus, the detailed description of the embodiments of the present invention, as represented in the attached figures, is not intended to limit the scope of the invention as claimed, but is merely representative of selected embodiments of the invention.

The features, structures, or characteristics of the invention described throughout this specification may be combined in any suitable manner in one or more embodiments. For example, reference throughout this specification to "certain embodiments," "some embodiments," or similar language means that a particular feature, structure, or characteristic described in connection with the embodiment is included in at least one embodiment of the present invention. Thus, appearances of the phrases "in certain embodiments," "in some embodiment," "in other embodiments," or similar language throughout this specification do not necessarily all refer to the same group of embodiments and the described features, structures, or characteristics may be combined in any suitable manner in one or more embodiments.

It should be noted that reference throughout this specification to features, advantages, or similar language does not imply that all of the features and advantages that may be realized should be or are in any single embodiment of the invention. Rather, language referring to the features and advantages is understood to mean that a specific feature, advantage, or characteristic described in connection with an embodiment is included in at least one embodiment of the present invention. Thus, discussion of the features and advantages, and similar language, throughout this specification may, but do not necessarily, refer to the same embodiment.

Furthermore, the described features, advantages, and characteristics of the invention may be combined in any suitable manner in one or more embodiments. One skilled in the relevant art will recognize that the invention can be practiced without one or more of the specific features or advantages of a particular embodiment. In other instances, additional features and advantages may be recognized in certain embodiments that may not be present in all embodiments of the invention.

One having ordinary skill in the art will readily understand that embodiments of the invention as discussed above may be practiced with steps in a different order, and/or with hardware elements in configurations which are different than those which are disclosed. Therefore, although the invention has been described based upon these preferred embodiments, it would be apparent to those of skill in the art that certain modifications, variations, and alternative constructions would be apparent, while remaining within the spirit and scope of the invention. In order to determine the metes and bounds of the invention, therefore, reference should be made to the appended claims.

The invention claimed is:

1. An integrated circuit chip comprising:
a wide bandgap semiconductor substrate;
a plurality of semiconductor electronic components disposed on the wide bandgap semiconductor substrate;
an overlying insulating layer disposed on the plurality of semiconductor electronic components; and
a first crack barrier that is laterally displaced from all of the plurality of semiconductor electronic components, wherein the first crack barrier comprises a plurality of crack barrier components, and wherein the crack barrier does not carry any electrical signals between the semiconductor devices;
wherein the plurality of crack barrier components comprises a first plurality of spaced apart segments;
wherein the plurality of crack barrier components comprises a second and a third plurality of spaced apart segments, wherein the second and third pluralities of spaced apart segments are parallel to the first plurality of spaced apart segments;
wherein spacing between the segments of the first plurality is different than spacing between segments of the second plurality; and
wherein the segments of the first, second, and third pluralities of segments possess different lengths.

2. The integrated circuit chip of claim 1, further comprising:
a plurality of interconnect traces that are separate from the first crack barrier; and a plurality of bond pads that are also separate from the first crack barrier, wherein the first crack barrier does not overlap with any of the interconnect traces and bond pads, and does not carry any electrical signals between the semiconductor devices, interconnect traces, and bond pads.

3. The integrated circuit chip of claim 2, further comprising a multi-layer interconnect structure comprising:
a first insulating layer disposed directly on the plurality of semiconductor devices; and
a first electrically conductive interconnect layer disposed on the first insulating layer and between the first insulating layer and the overlying insulating layer, wherein the first electrically conductive interconnect layer includes regions that are in conductive contact with at least some of the plurality of semiconductor electronic components.

4. The integrated circuit chip of claim 3, wherein the first crack barrier is formed from selective lateral patterning of the first interconnect layer.

5. The integrated circuit chip of claim 3, wherein the first crack barrier is encapsulated within dielectric material that the overlying insulating layer and the first insulating layer are constructed of.

6. The integrated circuit chip of claim 1, wherein the first crack barrier is disposed around a periphery of the integrated circuit chip between a boundary of the integrated circuit chip and bond pads disposed on the wide bandgap semiconductor substrate.

7. The integrated circuit chip of claim 1, wherein the first crack barrier laterally extends between two groupings of semiconductor electronic components.

8. The integrated circuit chip of claim 1, wherein the first crack barrier laterally surrounds alignment marks on the wide bandgap semiconductor substrate.

9. The integrated circuit chip of claim 1, further comprising a second crack barrier that is laterally displaced from all of the plurality of semiconductor electronic components, wherein the first crack barrier extends laterally between at least two of the plurality of semiconductor electronic devices, wherein the second crack barrier is disposed around a periphery of the integrated circuit chip between a boundary of the integrated circuit chip and bond pads disposed on the wide bandgap semiconductor substrate.

\* \* \* \* \*